United States Patent
Czech et al.

(10) Patent No.: US 6,686,098 B2
(45) Date of Patent: Feb. 3, 2004

(54) LITHOGRAPHY METHOD AND LITHOGRAPHY MASK

(75) Inventors: Günther Czech, Langebrück (DE); Christoph Friedrich, München (DE); Carsten Fülber, Dresden (DE); Rainer Käsmaier, Fraunberg (DE); Dietrich Widmann, deceased, late of Unterhaching (DE), by Helga Widmann, heir

(73) Assignee: Infineon Technologies AG, Munich (DE)

( * ) Notice: Subject to any disclaimer, the term of this patent is extended or adjusted under 35 U.S.C. 154(b) by 224 days.

(21) Appl. No.: 09/729,062

(22) Filed: Dec. 4, 2000

(65) Prior Publication Data

US 2001/0021475 A1 Sep. 13, 2001

(30) Foreign Application Priority Data

Dec. 2, 1999 (DE) .......... 199 58 201

(51) Int. Cl.⁷ .................. G03F 9/00
(52) U.S. Cl. .................. 430/5
(58) Field of Search .................. 430/5

(56) References Cited

U.S. PATENT DOCUMENTS

| | | |
|---|---|---|
| 4,890,309 A | 12/1989 | Smith et al. |
| 5,510,230 A | 4/1996 | Tennant et al. |
| 5,641,593 A | 6/1997 | Watanabe et al. |
| 5,733,688 A | 3/1998 | Kato et al. |
| 6,150,060 A | 11/2000 | Vernon |
| 6,159,643 A * | 12/2000 | Levinson et al. .......... 430/5 |

FOREIGN PATENT DOCUMENTS

EP 0 710 890 A1 5/1996

OTHER PUBLICATIONS

Yorick Trouiller et al.: "0.12 μm Optical Lithography Performances Using an Alternating Deep UV Phase Shift Mask", *Jpn. J. Appl. Phys.*, vol. 37, 1998, pp. 6714–6717.
C.W. Gwyn: "Extreme Ultraviolet Lithography", J. Vac. Sci. Technol. vol. B 16, No. 6, Nov./Dec. 1998, pp. 3142–3149.
B.J. Lin: "Phase–Shifting Masks Gain an Edge", *IEEE Circuits and Devices*, vol. 9, Mar. 1993, No. 2, pp. 28–35.
D.M. Tennant et al.: "Mask Technologies for Soft–X–Ray Projection Lithography at 13 nm", *Applied Optics*, Dec. 1, 1993, vol. 32, No. 4, pp. 7007–7011.
International Publication WO 87/07400 (Atkinson et al.), dated Dec. 3, 1987.
O.R. Wood II et al.: "Use of Attenuated Phase Masks in Extreme Ultraviolet Lithography", J. Vac. Sci. Technol. vol. B 15 No. 6, Nov./Dec. 1997, pp. 2448–2451.

* cited by examiner

*Primary Examiner*—Mark F. Huff
*Assistant Examiner*—Saleha R. Mohamedulla
(74) *Attorney, Agent, or Firm*—Laurence A. Greenberg; Werner H. Stemer; Gregory L. Mayback

(57) ABSTRACT

Layers are patterned with a lithography method during the fabrication of integrated circuits. A mask, which may be reflective or transmissive, for carrying out the method. The photosensitive layers are exposed to radiation that is emitted by a radiation source. The radiation lies in the extreme ultraviolet region and is guided via the mask onto the photosensitive layers.

11 Claims, 2 Drawing Sheets

LITHOGRAPHY METHOD AND LITHOGRAPHY MASK

BACKGROUND OF THE INVENTION

FIELD OF THE INVENTION

The invention lies in the integrated technology field. More specifically, the invention relates to a lithography method for patterning layers during the fabrication of integrated circuits, and to a mask suitable for use in the lithography process.

Lithography methods, which are based in particular on photolithography processes, are used for fabricating integrated circuits, in particular for fabricating interconnects for the wiring of integrated circuits.

Interconnects of this type are usually incorporated in insulator layers seated directly, or with the interposition of a metal layer, on a substrate containing the integrated circuits. Substrates of this type are usually formed of silicon layers, and the insulator layers are usually formed of oxide layers, preferably silicon oxides.

The fabrication of the interconnects in the insulator layer involves making contact holes and trenches running in one plane or in a plurality of planes, etching processes, in particular plasma etching processes, preferably being used for this purpose.

In order to make these trenches and contact holes in the insulator layer, a resist mask having a hole pattern corresponding to the trenches and/or to the contact holes is applied to the insulator layer. It is customary also for a plurality of resist masks to be applied one after the other in a multistage process, in order to make contact holes and/or trenches in a plurality of planes of the insulator layer.

The individual trenches and contact holes are etched in with predetermined depths through the corresponding openings in the resist masks. The resist masks are then removed from the insulator layer. Finally, metal is deposited into the trenches and/or contact holes in order to fabricate the interconnects.

The fabrication of resist masks on the insulator layers is effected with known photolithography processes. In that case, first of all a radiation-sensitive resist layer is applied to the insulator layer. The emplacement of templates or the like results in the resist layer being exposed to radiation, in particular light radiation, at predetermined locations. Afterward, either only the exposed or only the unexposed regions of the resist layer are removed in a suitable developer. A so-called positive resist is present in the first case, and a negative resist in the second case. The resist layer with the hole pattern produced in this way then forms the resist mask for the subsequent etching processes.

During the exposure process, the radiation, in particular light beams, should be imaged as accurately as possible onto the surface of the resist layer in accordance with a predetermined hole pattern. The object is thereby to obtain a maximum resolution, which is synonymous with obtaining the most abrupt transition possible between exposed and unexposed locations in the photoresist layer.

The exposure is thereby effected in such a way that radiation is emitted by a radiation source and focused via an objective onto an image plane in which the resist layer is situated. In the image plane, individual substrates with the resist layers applied thereon are positioned by means of a stepper in the beam path of the beams emitted by the radiation source.

In the course of exposure, the radiation is guided through a mask, wherein it is possible for a specific exposure pattern to be predetermined by the structure of the mask. The mask is usually designed as a binary mask, for example in the form of a chromium mask. Such chromium masks have an alternating structure of transparent regions, preferably formed by a glass layer, and non-transparent layers, formed by the chromium layers.

In order to increase the contrast between exposed and unexposed regions on the resist layer, a phase mask is used instead of a chromium mask.

Such a phase mask may be designed, in particular, as a halftone phase mask. In the case of such halftone phase masks, the opaque layer is replaced by a semitransparent layer having a transmission typically of 6%, whose layer thicknesses are designed such that the radiation that passes through experiences a phase swing of 180°.

Furthermore, the phase mask may also be structured as an alternating phase mask. Such an alternating phase mask has adjacent transparent regions which are separated by a chromium layer in each case and each have phases shifted by 180°. This means that the radiation which passes through one transparent region has a phase offset of 180° relative to the radiation which is guided through the adjacent transparent region.

Irrespective of the choice of different masks, the minimum feature sizes which can be produced using prior art photolithography methods are limited by the wavelengths of the predetermined radiation. In conventional photolithography methods, lasers are usually used as radiation sources, the wavelengths of which preferably lie in the visible region. Smaller feature sizes can be produced for example by using lasers which emit radiation in a wavelength range of about 200 nm. Examples of such radiation sources are argon fluoride lasers which emit radiation at wavelengths of about 193 nm.

SUMMARY OF THE INVENTION

The object of the invention is to provide a lithography method and a mask suitable therefor which overcome the above-noted deficiencies and disadvantages of the prior art devices and methods of this kind, and which enable the production of structures in photosensitive layers with the smallest possible feature sizes.

With the above and other objects in view there is provided, in accordance with the invention, a lithography method for patterning layers during the fabrication of integrated circuits, which comprises:

emitting radiation in an extreme ultraviolet range from a radiation source;

guiding the radiation via a mask; and guiding the radiation from the mask and exposing a photosensitive layer of material to the radiation.

In accordance with an added feature of the invention, the radiation emitted from the radiation source lies in a wavelength range of 11 nm $\leq \lambda \leq$ 14 nm.

In accordance with an additional feature of the invention, a xenon plasma source is used as the radiation source.

In the case of the lithography method according to the invention, for the purpose of patterning layers during the fabrication of integrated circuits, photosensitive layers are exposed with radiation whose wavelength lies in the ultraviolet region. On a mask there are a plurality of feature sizes which are exposed with the same wavelength. In this case, the wavelengths used preferably lie in the range from 11 nm to 14 nm.

The method according to the invention enables the minimum feature sizes which are produced on the photosensitive layers to be considerably reduced. The minimum feature size which can be fabricated using a lithography method is defined by the following relationship:

$$x = k_1 \cdot \lambda / NA$$

where $\lambda$ is the wavelength of the radiation used in the exposure and NA is the numerical aperture of the imaging system used. The factor $k_1$ is dependent on the design of the respective mask used. For binary masks, the factor $k_1$ lies in the range between 0.5 and 0.7. If a halftone phase mask is used, the factor $k_1$ typically lies in the range from 0.38 to 0.55. The best results are obtained with alternating phase masks. In this case, the factor $k_1$ lies in the range from 0.2 to 0.38.

For the exposure, the invention uses radiation in the extreme ultraviolet region, whose wavelengths are about one order of magnitude shorter than in the case of known photolithography methods. The optical imaging system then preferably comprises mirror systems. Although the apertures used in this case are distinctly smaller than the apertures used in conventional light optics, this is overcompensated by the reduction in the wavelength, so that a distinctly improved resolution is obtained compared with conventional light optical systems.

With the above and other objects in view there is also provided, in accordance with the invention, a mask assembly for performing the afore-mentioned lithography method. The mask assembly is formed with a plurality of layers, the layers having a feature sizes matched to a wavelength of the radiation emitted by the radiation source and lying in the extreme ultraviolet range.

The mask assembly according to the invention may not only be formed as a binary mask but also as a phase mask, in which case the phase mask may be designed as a halftone phase mask or else as an alternating phase mask.

In the latter case, the masks according to the invention are each expediently constructed in such a way that they have a thin, transparent silicon layer as carrier layer. In accordance with the design of the mask as a binary mask or phase mask, further transparent and/or opaque layers are applied to this carrier layer. These layers are preferably composed of silicon or molybdenum.

Masks of this type are transmission masks. As an alternative, the masks may also be formed as reflection masks, the mask in this case additionally having a non-transparent, reflective layer. As an alternative, the transparent carrier layer may be replaced by a non-transparent carrier layer.

Other features which are considered as characteristic for the invention are set forth in the appended claims.

Although the invention is illustrated and described herein as embodied in a lithography method and mask for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
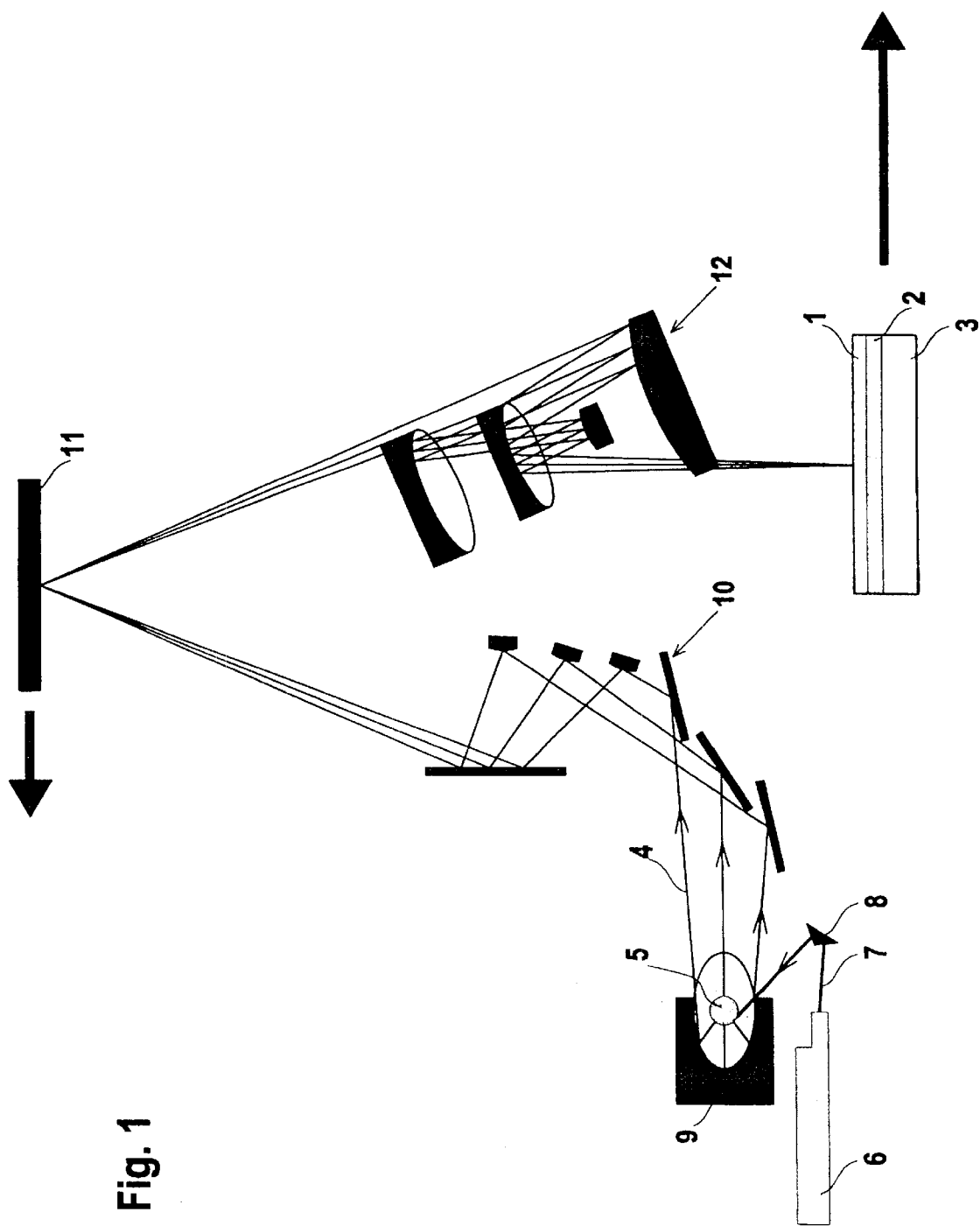
FIG. 1 is a schematic illustration of a configuration for carrying out the lithography method according to the invention.

Referring now to the figures of the drawing in detail and first, particularly, to FIG. 1 thereof, there is seen an exemplary embodiment of a configuration for carrying out the lithography method according to the invention for exposing a photosensitive layer. Such processes are used during the fabrication of integrated circuits.

The photosensitive layer, in the particular case, is a resist layer 1. The resist layer 1 is applied for example on an insulator layer 2, which is seated directly, or with the interposition of a metal layer, on a substrate 3 containing integrated circuits. The substrate 3 is preferably composed of silicon. The insulator layer 2 is preferably composed of a silicon oxide. Interconnects are incorporated in the insulator layer 2. Trenches and contact holes are etched in for the purpose of fabricating the interconnects according to a predetermined pattern. Metal is subsequently deposited into the trenches and contact holes.

The trenches and contact holes are made in the insulator layer 2 by means of an etching process, preferably by means of a plasma etching process. For this purpose, at least one resist mask having a hole pattern corresponding to the trenches and contact holes is fabricated from the resist layer 1 bearing on the insulator layer 2. Trenches and contact holes are made by etching through the holes in the resist mask.

The lithography method according to the invention is used to fabricate the resist mask from the resist layer 1. For this purpose, the resist layer 1 is exposed at predetermined locations and then developed. Depending on whether the resist layer 1 is a positive or negative resist, the exposed or unexposed regions of the resist layer 1 are removed during development.

In order to carry out the exposure process, a radiation source 5 emitting radiation 4 is provided.

In the present case, the radiation source 5 is formed by a xenon plasma source which emits radiation 4 in the extreme ultraviolet UV region. The wavelength $\lambda$ of the emitted radiation 4 lies in the range of 11 nm $\leq \lambda \leq$ 14 nm.

The radiation source 5 is optically excited by means of an NdYAG laser 6. For this purpose, the laser light beams 7 emitted by the NdYAG laser 6 are guided via a prism 8 to the radiation source 5.

The radiation source 5 is situated at the focal point of a parabolic mirror 9. The radiation 4 reflected from the parabolic mirror 9 is guided via a first mirror system 10. The radiation 4 is thereby focused onto a mask 11. In the present case, the mask 11 is implemented as a reflection mask.

The radiation 4 reflected from the mask 11 is guided via a second mirror system 12, comprising aspherical mirrors, onto the resist layer 1 to be exposed. In accordance with the pattern of the mask 11, an exposure pattern is then produced on the resist layer 1. For this purpose, the mask 11 and the resist layer are displaced in a suitable form, by means of a non-illustrated stepper system, transversely with respect to the beam axis of the radiation 4.

The exemplary embodiment illustrated in FIG. 1 achieves a numerical aperture which typically amounts to about NA=0.1.

Figure 2:
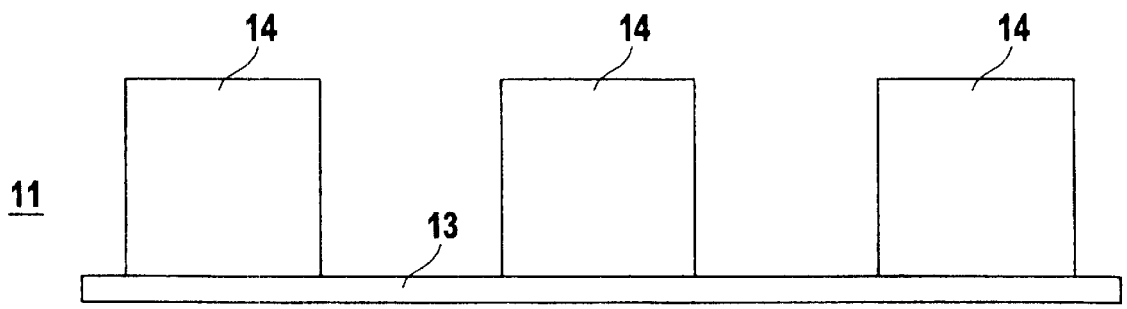
FIG. 2 is a schematic illustration of a mask for carrying out the method according to the invention, the mask being a binary mask.
Figure 3:
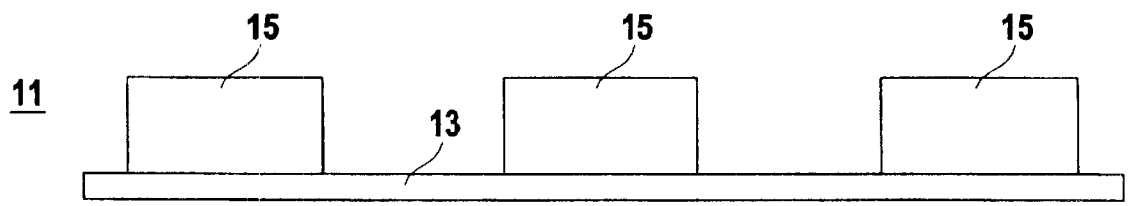
FIG. 3 is a schematic illustration of a mask for carrying out the method according to the invention, the mask being a halftone phase mask.
Figure 4:
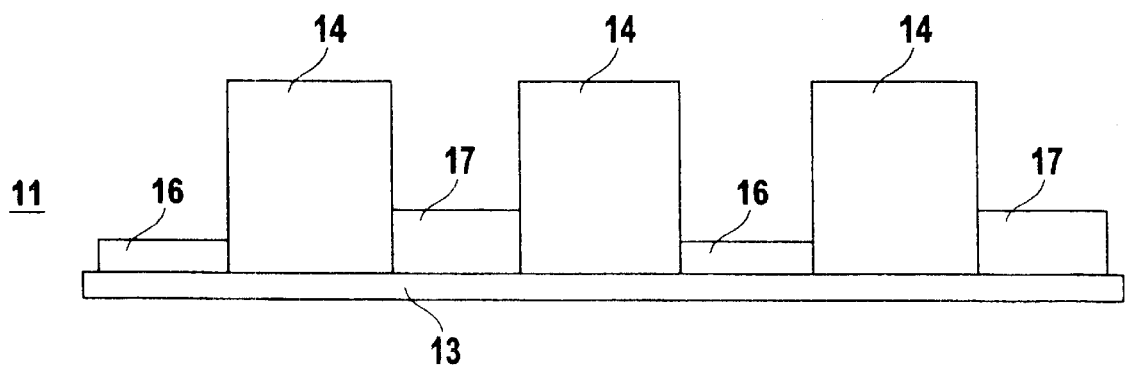
FIG. 4 is a schematic illustration of a mask for carrying out the method according to the invention, the mask being an alternating phase mask.

The mask 11 has structures of transparent and/or opaque zones whose feature sizes are matched to the wavelengths of the radiation 4 used. Whereas the mask 11 as shown in FIG. 1 is designed as a reflection mask, the masks 11 illustrated in FIGS. 2 to 4 are designed as transmission masks.

These masks 11 each comprise an arrangement of different layers of silicon and/or molybdenum. The layer thicknesses of the individual layers are thereby dimensioned so as to obtain a predetermined absorption and phase shift of the radiation 4 penetrating through these layers.

In this case, the absorption when the radiation 4 passes through a layer having a layer thickness d is calculated according to the following relationship:

$$I=I_o e^{-2\alpha d}$$

where $I_o$ is the intensity of the incident radiation 4 and I is the intensity of the radiation upon emerging from the layer. Finally, α is the absorption coefficient of the relevant layer.

The phase shift Δφ of the radiation 4 penetrating through a layer of layer thickness d is calculated according to the following relationship:

$$\Delta\phi=360°\cdot(n-1)\cdot d/\lambda$$

where n is the refractive index of the respective layer.

The material constants for silicon and molybdenum are given as follows:

$$n_{Mo}=1+7\cdot10^{-2},\ \alpha_{Mo}=2.9\cdot10^{-3}/nm$$

$$n_{Si}=1.0,\ \alpha_{Si}=0.87\cdot10^{-3}/nm$$

This reveals, in particular, that radiation 4 which is guided through a molybdenum layer experiences a phase shift, but a radiation 4 which is guided through a silicon layer does not.

FIG. 2 schematically shows a first exemplary embodiment of the mask 11 according to the invention. This mask 11 is designed as a binary mask. The mask 11 has a thin, transparent carrier layer 13. The carrier layer 13 comprises a silicon layer having a layer thickness of 100 nm. Opaque regions 14 are applied to the carrier layer 13 in accordance with the exposure pattern to be produced. The opaque regions 14 likewise comprise silicon layers which, however, have considerably greater layer thicknesses than the carrier layer 13.

In the present exemplary embodiments, the layer thickness of the silicon layers forming the opaque regions 14 is 2.6 μm. In the case of the binary mask 11 designed in this way, the intensity loss of the radiation 4 is about 20% when passing through the transparent carrier layer 13, and about 99% when passing through the opaque regions 14.

FIG. 3 shows a further exemplary embodiment of the mask 11 according to the invention. The mask 11 is designed as a halftone mask and again has a transparent carrier layer 13 formed by a silicon layer having a layer thickness of 100 nm. Phase-shifting, partly transparent regions 15 are applied on the carrier layer 13 in accordance with the exposure pattern to be produced. The phase-shifting, partly transparent regions 15 are formed by molybdenum layers having a layer thickness of 455 nm. In this case, the layer thickness of the molybdenum layer is chosen so as to obtain a phase shift of 180° for the radiation 4 which permeates the layer.

The carrier layer 13 has a transmission of about 80%. In the case of the phase-shifting, partly transparent regions 15, the intensity loss of the radiation 4 which penetrates through the regions 15 is about 94%.

In the exemplary embodiment illustrated in FIG. 4, the mask 11 according to the invention is designed as an alternating phase mask. Once again, the phase mask has a transparent carrier layer 13 formed by a silicon layer having a layer thickness of 100 nm. First and second transparent regions 16, 17 are alternately applied on the carrier layer 13, the regions being separated by opaque regions 14. In this case, the radiation 4 which penetrates through a first transparent region 16 has a phase shifted by 180° relative to the radiation 4 which penetrates through a second transparent region 17.

The first transparent regions 16 are each formed by a molybdenum layer having a layer thickness of 93 nm. The second transparent regions 17 are each formed by a silicon layer having a layer thickness of 315 nm. The effect achieved by this choice of layer thicknesses is that the radiation 4 which penetrates through a first and second transparent region 16, 17 is attenuated identically in each case. In the present case, the transmission for the first and second transparent regions 16, 17 is in each case about 58% of the intensity of the incident radiation 4. Upon passing through a first transparent region 16 formed by the molybdenum layer, the radiation 4 experiences a phase shift of 180°. By contrast, the phase of the radiation 4 remains unchanged upon passing through a second transparent region 17 formed by a silicon layer.

The opaque regions 14 of the alternating phase mask are formed by silicon layers having a layer thickness of 2.6 μm in each case. The opaque regions 14 are thus configured in accordance with the binary mask 11 as shown in FIG. 2.

We claim:

1. A mask, comprising:
   a plurality of layers with feature sizes matched to a reflection wavelength within an extreme ultraviolet range, said layers forming a binary transmission mask having a transparent carrier layer formed by:
   a first silicon layer; and
   a second silicon layer forming opaque regions mutually spaced from one another on said carrier layer.

2. The mask assembly according to claim 1, wherein said mask is a reflection mask.

3. The mask assembly according to claim 1, wherein said first silicon layer has a layer thickness of about 100 nm, and said second silicon layer has a layer thickness of about 2.6 μm.

4. A mask, comprising:
   a plurality of layers having feature sizes matched to a wavelength within the extreme ultraviolet range, said layers forming a halftone phase transmission type mask.

5. The mask assembly according to claim 4, wherein said mask has a transparent carrier layer formed of silicon, and a molybdenum layer defining phase-shifting, partly transparent regions disposed at a mutual spacing distance from one another on said carrier layer.

6. The mask assembly according to claim 5, wherein said silicon carrier layer has a layer thickness of about 100 nm and said molybdenum layer has a layer thickness of about 455 nm.

7. The mask assembly according to claim 6, wherein said molybdenum layer is configured to phase-shift radiation passing therethrough by 180°.

8. A mask, comprising:

a plurality of layers with feature sizes matched to a reflection wavelength within an extreme ultraviolet range, said layers forming an alternating phase shift transmission mask having a transparent carrier layer formed of silicon, opaque regions, and first and second transparent regions spaced apart on said carrier layer and separated by said opaque regions, said first transparent region being configured to phase shift radiation penetrating therethrough by 180° relative to radiation penetrating through said second transparent region.

9. The mask assembly according to claim 8, wherein said first transparent regions are formed by molybdenum layers having a layer thickness of about 93 nm.

10. The mask assembly according to claim 8, wherein said second transparent regions are first silicon layers having a layer thickness of about 315 nm.

11. The mask assembly according to claim 8, wherein said opaque regions are second silicon layers having a layer thickness of about 2.6 $\mu$m.

* * * * *